US012418160B2

(12) United States Patent
Zhao et al.

(10) Patent No.: US 12,418,160 B2
(45) Date of Patent: Sep. 16, 2025

(54) VERTICAL-CAVITY SURFACE-EMITTING LASER ARRAY WITH ISOLATED CATHODES AND A COMMON ANODE

(71) Applicant: Lumentum Operations LLC, San Jose, CA (US)

(72) Inventors: Guowei Zhao, Milpitas, CA (US); Matthew Glenn Peters, Menlo Park, CA (US); Jun Yang, Cupertino, CA (US); Eric R. Hegblom, Sunnyvale, CA (US)

(73) Assignee: Lumentum Operations LLC, San Jose, CA (US)

( * ) Notice: Subject to any disclaimer, the term of this patent is extended or adjusted under 35 U.S.C. 154(b) by 0 days.

(21) Appl. No.: 18/390,648

(22) Filed: Dec. 20, 2023

(65) Prior Publication Data
US 2024/0146027 A1    May 2, 2024

Related U.S. Application Data

(63) Continuation of application No. 17/135,511, filed on Dec. 28, 2020, now Pat. No. 11,855,413.

(Continued)

(51) Int. Cl.
*H01S 5/183*       (2006.01)
*H01S 5/042*       (2006.01)
(Continued)

(52) U.S. Cl.
CPC ...... *H01S 5/18361* (2013.01); *H01S 5/04256* (2019.08); *H01S 5/18311* (2013.01); *H01S 5/3416* (2013.01); *H01S 5/423* (2013.01)

(58) Field of Classification Search
CPC ............ H01S 5/18361; H01S 5/04256; H01S 5/18311; H01S 5/3416; H01S 5/423;
(Continued)

(56) References Cited

U.S. PATENT DOCUMENTS 5,936,266 A    8/1999  Holonyak, Jr. et al.
6,052,398 A    4/2000  Brillouet et al.
(Continued)

OTHER PUBLICATIONS

Lear, K., et al., "Vertical Cavity Lasers on P-Doped Substrates", Electronics Letter, Apr. 1997, vol. 33, No. 9, pp. 783-784.

(Continued)

*Primary Examiner* — Yuanda Zhang
(74) *Attorney, Agent, or Firm* — Harrity & Harrity, LLP

(57) ABSTRACT

A vertical-cavity surface-emitting laser (VCSEL) array may include an n-type substrate layer and an n-type metal on a bottom surface of the n-type substrate layer. The n-type metal may form a common anode for a group of VCSEL. The VCSEL array may include a bottom mirror structure on a top surface of the n-type substrate layer. The bottom mirror structure may include one or more bottom mirror sections and a tunnel junction to reverse a carrier type within the bottom mirror structure. The VCSEL array may include an active region on the bottom mirror structure and an oxidation layer to provide optical and electrical confinement. The VCSEL array may include an n-type top mirror on the active region, a top contact layer over the n-type top mirror, and a top metal on the top contact layer. The top metal may form an isolated cathode for the VCSEL array.

19 Claims, 13 Drawing Sheets

Related U.S. Application Data

(60) Provisional application No. 63/042,283, filed on Jun. 22, 2020.

(51) Int. Cl.
*H01S 5/34* (2006.01)
*H01S 5/42* (2006.01)

(58) Field of Classification Search
CPC ............. H01S 5/04252; H01S 5/04254; H01S 5/18394; H01S 2301/176; H01S 5/3095; H01S 5/18325
See application file for complete search history.

(56) References Cited

U.S. PATENT DOCUMENTS

| | | | |
|---|---|---|---|
| 6,487,230 | B1 | 11/2002 | Boucart et al. |
| 6,760,357 | B1 | 7/2004 | Boucart et al. |
| 6,771,680 | B2 | 8/2004 | Bour et al. |
| 6,798,817 | B2 | 9/2004 | Coldren et al. |
| 6,936,486 | B2 | 8/2005 | Cheng et al. |
| 6,982,439 | B2 | 1/2006 | Bhat et al. |
| 7,123,638 | B2 | 10/2006 | Leary et al. |
| 7,257,141 | B2 | 8/2007 | Chua |
| 7,501,294 | B1 | 3/2009 | Nakagawa |
| 7,620,087 | B2 | 11/2009 | Philippens et al. |
| 7,856,045 | B2 | 12/2010 | Philippens et al. |
| 7,916,768 | B2 | 3/2011 | Chang et al. |
| 8,355,423 | B2 | 1/2013 | Moser et al. |
| 9,088,134 | B2 | 7/2015 | Hibbs-Brenner et al. |
| 10,014,661 | B2 | 7/2018 | Brenner et al. |
| 11,855,413 | B2 | 12/2023 | Zhao et al. |
| 2010/0111125 | A1 | 5/2010 | Kondo |
| 2012/0138130 | A1 | 6/2012 | Guter et al. |
| 2017/0256915 | A1 | 9/2017 | Ghosh et al. |
| 2017/0277065 | A1 | 9/2017 | Kondo |
| 2018/0226768 | A1 | 8/2018 | Brenner et al. |
| 2018/0233534 | A1 | 8/2018 | Kondo |
| 2018/0241177 | A1 | 8/2018 | Wong et al. |
| 2019/0067906 | A1 | 2/2019 | Yuen et al. |
| 2020/0321753 | A1* | 10/2020 | Mueller ................ H01S 5/3054 |

OTHER PUBLICATIONS

Vertilas., "InP BTj VCSEL Device Concept" 2014, 1 page. (https://www.vertilas.com/contentlinp-btj-vcsel-device-concept#:-:text=Vertilas%20lasers%20are%20based%20on,surface%20of"/o2othe%20semiconductor%20device).

* cited by examiner

VERTICAL-CAVITY SURFACE-EMITTING LASER ARRAY WITH ISOLATED CATHODES AND A COMMON ANODE

CROSS-REFERENCE TO RELATED APPLICATION

This application is a continuation of U.S. patent application Ser. No. 17/135,511, filed Dec. 28, 2020 (now U.S. Pat. No. 11,855,413), which claims priority to U.S. Provisional Patent Application No. 63/042,283, filed on Jun. 22, 2020, and entitled "VERTICAL-CAVITY SURFACE-EMITTING LASER ARRAYS WITH ISOLATED CATHODES AND A COMMON ANODE." The disclosures of the prior applications are considered part of and are incorporated by reference into this patent application.

TECHNICAL FIELD

The present disclosure relates generally to a vertical-cavity surface-emitting laser (VCSEL) array and, more particularly, to a VCSEL array with an isolated cathode and a common anode.

BACKGROUND

A VCSEL is a semiconductor laser, more specifically a diode laser with a monolithic laser resonator, where light is emitted in a direction perpendicular to a chip surface. Typically, the laser resonator consists of two distributed Bragg reflector (DBR) mirrors parallel to the chip surface, between which is an active region (consisting of one or more quantum wells) that generates light. Commonly, the upper and lower mirrors of a VCSEL are doped as p-type and n-type materials, respectively, thereby forming a diode junction.

SUMMARY

In some implementations, a VCSEL array may include an n-type substrate layer having a top surface and a bottom surface; an n-type metal on the bottom surface of the n-type substrate layer, the n-type metal forming a common anode for a group of VCSEL arrays including the VCSEL array; a bottom mirror structure on the top surface of the n-type substrate layer, the bottom mirror structure comprising one or more bottom mirror sections, and a tunnel junction to reverse a carrier type within the bottom mirror structure; an active region on the bottom mirror structure; an oxidation layer to provide optical and electrical confinement of VCSELs of the VCSEL array; an n-type top mirror on the active region; a top contact layer over the n-type top mirror; and a top metal on the top contact layer, the top metal forming an isolated cathode for the VCSEL array.

In some implementations, an optical device may include a plurality of VCSEL arrays, the plurality of VCSEL arrays including an n-type metal on a first surface of an n-type substrate layer, the n-type metal forming a common anode for each VCSEL array of a plurality of VCSEL arrays; a bottom mirror structure on a second surface of the n-type substrate layer, the bottom mirror structure comprising at least one bottom mirror section, and a tunnel junction to reverse a carrier type within the bottom mirror structure; an active region on the bottom mirror structure; an oxidation layer to provide optical and electrical confinement of VCSELs included in the plurality of VCSEL arrays; an n-type top mirror on the active region; a top contact layer over the n-type top mirror; and a top metal on the top contact layer, the top metal forming isolated cathodes for each VCSEL array of the plurality of VCSEL arrays.

In some implementations, a method may include forming an n-type metal on a first surface of an n-type substrate layer, the n-type metal providing a common anode for a plurality of VCSEL arrays; forming a bottom mirror structure on a second surface of the n-type substrate layer, the bottom mirror structure comprising one or more bottom mirror sections, and a tunnel junction to reverse a carrier type within the bottom mirror structure; forming an active region on the bottom mirror structure; forming an oxidation layer to provide optical and electrical confinement of VCSELs of included in the plurality of VCSEL arrays; forming an n-type top mirror on the active region; forming a top contact layer over the n-type top mirror; and forming a top metal on the top contact layer, the top metal providing an isolated cathode for each VCSEL array of the plurality the VCSEL arrays.

DETAILED DESCRIPTION

Figure 1A:
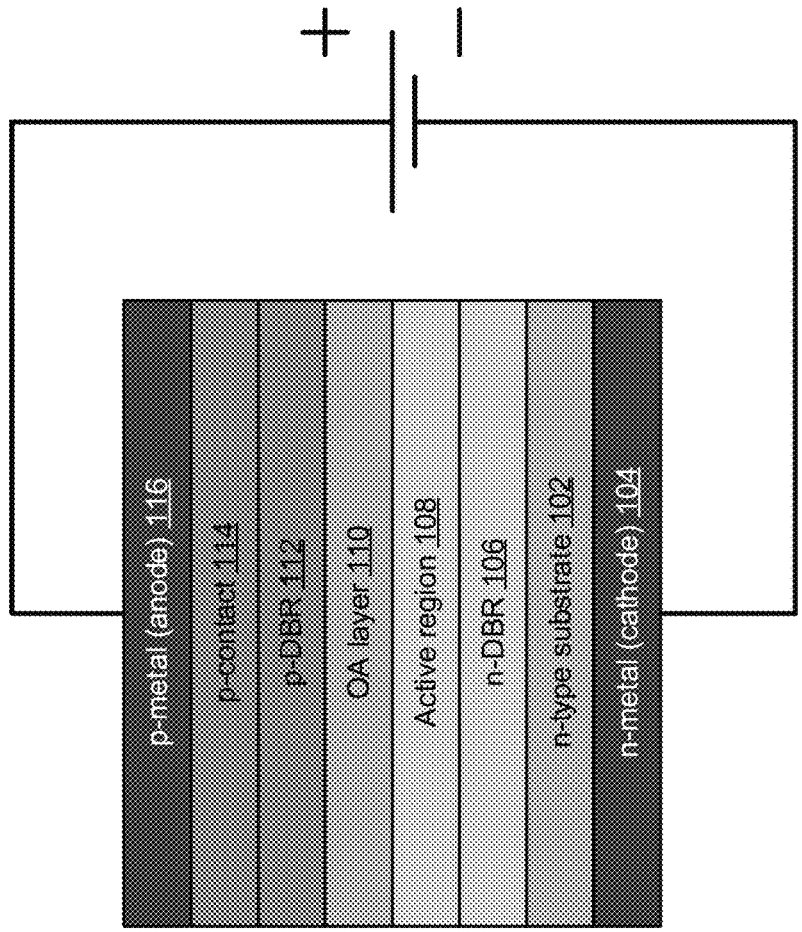
FIGS. 1A and 1B are diagrams illustrating an example of a conventional VCSEL.

The following detailed description of example implementations refers to the accompanying drawings. The same reference numbers in different drawings may identify the same or similar elements.

A two-dimensional (2D) VCSEL array can be used in, for example, a three-dimensional sensing (3DS) application. In 3DS applications, there is an increasing need for VCSEL arrays with multiple groups of emitters (e.g., sub-arrays) that have separate electrical connections (e.g., to permit illumination of different patterns or different portions of a scene). Often, systems are designed so that these multiple groups of emitters (e.g., on the same chip) are driven independently from a single integrated circuit chip.

A current source is typically required to drive such a VCSEL array in a stable manner because a differential resistance is low and inversely varies with the number of emitters, which can vary part-to-part. In practice, at an output stage of a current source, the VCSEL array is connected to a transistor, such as a bi-polar junction transistor (BJT), a metal oxide semiconductor field-effect transistor (MOSFET), or a metal semiconductor field-effect transistors (MESFET). A BJT may be n-p-n or may be p-n-p. Similarly, a MOSFET may be n-channel or p-channel, where n and p indicate a carrier type in the transistor sections. The carrier-type of the transistor dictates the relative polarity of transistor terminals in operation. Notably, in the case of MOSFETs, performance characteristics of n-channel transistors are generally superior to those of p-channel transistors. (e.g., an n-channel transistor has a comparatively higher speed and lower resistance due to higher mobility of electrons over holes). Likewise for BJTs, performance characteristics of n-p-n transistors are often superior to those of p-n-p transistors. Therefore, it is desirable to use n-channel transistors (in the case of MOSFETS) or n-p-n transistors (in the case of BJTs) when driving VCSEL arrays.

Additionally, to reduce complexity of fabrication, a VCSEL array with multiple sections may be designed such that the sections of the VCSEL array share either a common anode or a common cathode. However, for such a multi-section VCSEL array with a common contact (either common anode or common cathode), circuit designs and transistor types possible in the output stage of the current driver may be restricted. For example, a multi-section VCSEL array with a common cathode can be driven by an array of p-n-p transistors (or an array of p-channel transistors), where each transistor drives a different section of the VCSEL array. Here, due to circuit configurations typically used in a current driver, the p-n-p transistors (or p-channel transistors) that provide current to the multi-section VCSEL array require isolated anodes and a common cathode. As another example, a multi-section VCSEL array with a common anode can be driven by an array of n-p-n transistors (or an array of n-channel transistors), where each transistor drives a different section of the VCSEL array. Here, due to the typical circuit configurations, the n-p-n transistors (or n-channel transistors) that provide current to the multi-section VCSEL array require isolated cathodes and a common anode.

Generally speaking, a single section VCSEL array may be used with transistors of either carrier type—an n-channel or a p-channel in the case of MOSFETs—without restriction on the circuit design. However, even for a single-section VCSEL array, it may be desirable for a substrate to serve as the anode. For example, if multiple chips are bonded relatively close to one another, then it may be desirable to electrically connect the substrates to permit as close a spacing as possible without a need to manage conductive epoxy or solder die attach materials from shorting the two arrays. In such a case, the chips would act electrically like a multi-section VCSEL array, and it would desirable for the substrate to act as an anode when driven with an n-channel transistor or an n-p-n transistor. Notably, fabrication of a multi-section VCSEL arrays with each section having both isolated cathodes and isolated anodes is possible, and in such a case there would be no restriction on the circuit and transistor type for the output stage of the current driver. However, such a multi-section VCSEL array would require additional processing steps and die area, leading to higher fabrication costs.

Additionally, a common anode design with an n-type substrate is superior to a common anode design with a p-type substrate because p-type substrates have higher defect density and are not presently manufactured in high volume. Further, p-type substrates have a higher (e.g., more than two times) amount of optical loss as compared to n-type substrates, a characteristic which is particularly relevant to bottom emitting VCSELs (e.g., VCSELs that emit light through the substrate). Furthermore, the poor mobility of holes means that a conductivity of a p-type substrate may be four to ten times worse than that of an n-type substrate. When fabricating dense arrays of emitters (e.g., a few hundred emitters per square millimeter) carrying a few amperes per square millimeter, this voltage drop becomes significant. Thus, an n-type common anode VCSEL array is superior for high-volume manufacturability, reliability, and performance.

Some implementations described herein provide a VCSEL array including one or more sub-arrays on a common n-type substrate, where the substrate serves as a common anode (rather than a common cathode) and isolated cathodes for each group of emitters on the substrate. In some implementations, VCSELs in the VCSEL array have a tunnel junction positioned within a lower DBR (e.g., the DBR closest to the substrate) to permit the n-type substrate to serve as a common anode for the sub-arrays, and each of the sub-arrays has a respective isolated cathode (e.g., formed at a surface of the epitaxy). Additional details are provided below.

Notably, while the VCSEL arrays described herein can be used in a 3DS application, the VCSEL arrays described here may be used in another type of application, such as a data communication application in which a sub-array includes a single emitter and a multi-channel driver is used to drive different communication channels.

Figure 1B:
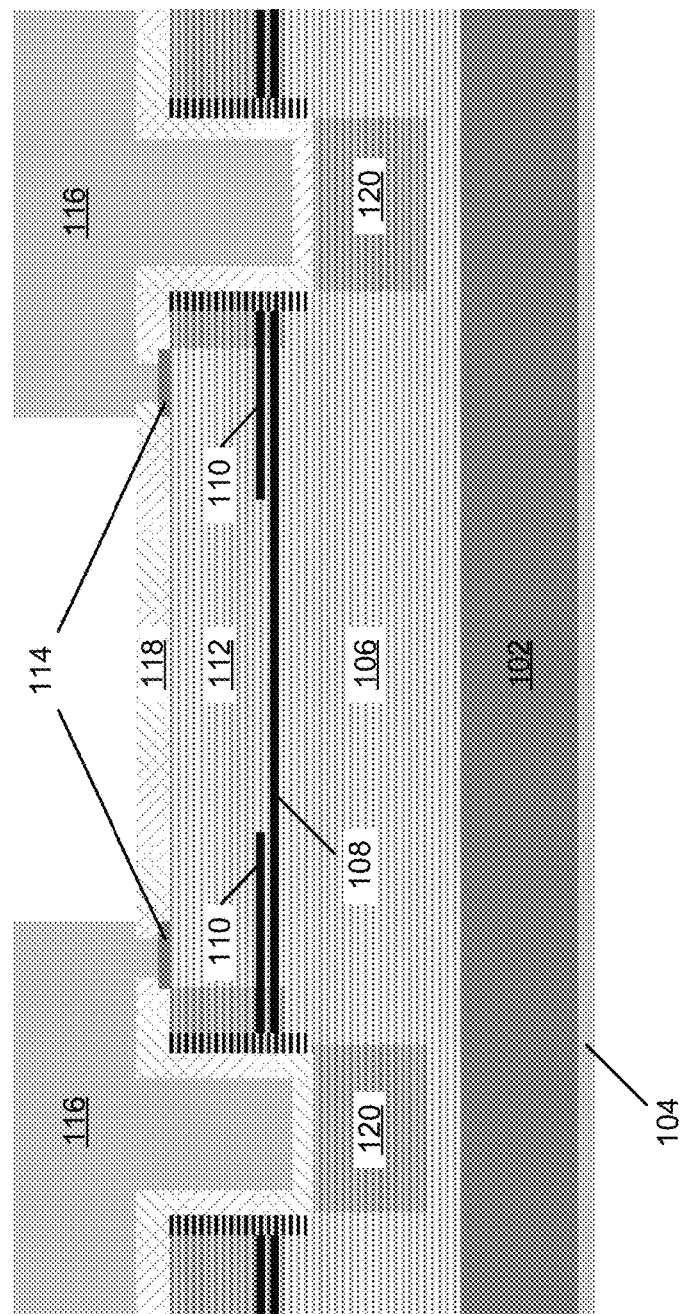

FIGS. 1A and 1B are diagrams associated with a conventional VCSEL array 100. FIG. 1A is a diagram illustrating various layers of the VCSEL array 100, while FIG. 1B is a diagram illustrating an example of a cross section of a particular VCSEL in the VCSEL array 100 with the layers shown in FIG. 1A. As shown in FIGS. 1A and 1B, the VCSEL array 100 includes an n-type substrate 102 with an n-type metal 104—serving as a cathode—on a bottom surface and an n-type DBR 106 on a top surface. As further shown, the VCSEL array 100 includes an active region 108 on the n-type DBR 106, and a p-type DBR 112 on the active region 108. As further shown, a p-type contact 114 is placed on the p-type DBR 112, and a p-type metal 116—serving as an anode—on the p-type contact 114. As further shown, the VCSEL array 100 includes an oxidation layer 110 that forms an oxide aperture (for providing optical and electrical confinement of the VCSEL array 100). As shown, the oxidation layer 110 is typically above the active region 108 in the p-type DBR 112. Notably, as shown in FIG. 1B, the VCSEL array 100 further includes a dielectric layer 118 and an isolation implant 120.

As noted above, the VCSEL array 100 is formed with the n-type substrate 102 and all VCSELs of the VCSEL array 100 share a common backside cathode (e.g., n-type metal 104) and, in some cases, can be formed with multiple isolated front-side anodes (e.g., formed in p-type metal 116), each connected to a different group (e.g., sub-array) of VCSELs. In such a case, a backside contact to the n-type substrate 102 through the n-type DBR 106 is connected to an n-layer of a light emitting p-i-n diode junction in the active region 108. Because this junction must be forward biased to emit light, the p-type side of the VCSEL array 100 (i.e., the top of the epitaxy of the VCSEL array 100) serves as the anode and the n-type side of the VCSEL array 100 (i.e., the n-type substrate 102) serves as the cathode.

Notably, p-type substrates (e.g., p-type GaAs substrates) have been used to obtain a configuration in which the backside contact to the p-type substrate connects to the p-type side of the light emitting p-i-n diode junction (through a lower p-DBR) and the top of the epitaxy (through an upper n-DBR) connects to the n-type side of the light emitting p-i-n diode junction. However, such a configuration requires a p-type substrate which, as noted above, has a higher defect density and absorbs more light than n-type substrates and, therefore, is undesirable.

Further, it is possible to achieve a common anode VCSEL array on a single substrate with a different design such that the substrate is isolated from a bottom (lower) DBR of the VCSEL array. In such a case, a p-type contact and a p-DBR are on a top side of the epitaxy and an n-DBR is on the lower side of the VCSEL array (e.g., similar to the VCSEL array 100), but with the substrate isolated, independent connections to cathodes of sub-arrays of the VCSELs may be made. However, this design requires more complex fabrication to contact the n-DBR, in contrast to a single blanket metal contact of the substrate as used in the VCSEL array 100 and, therefore, is undesirable.

Additionally, a configuration in which both anodes and cathodes for different sub-arrays of a VCSEL array on the same substrate may be employed. Such a design is no longer common anode, but may be used with driver circuits designed for either common anode or common cathode VCSEL arrays (e.g., those with either n-channel FETs or p-channel FETs at the output stage of the driver). However, like the design in which the substrate is isolated from the bottom DBR described above, such a design is more complex to fabricate and requires more chip area as compared to the design of VCSEL array 100 and, therefore, is undesirable.

Figure 2A:
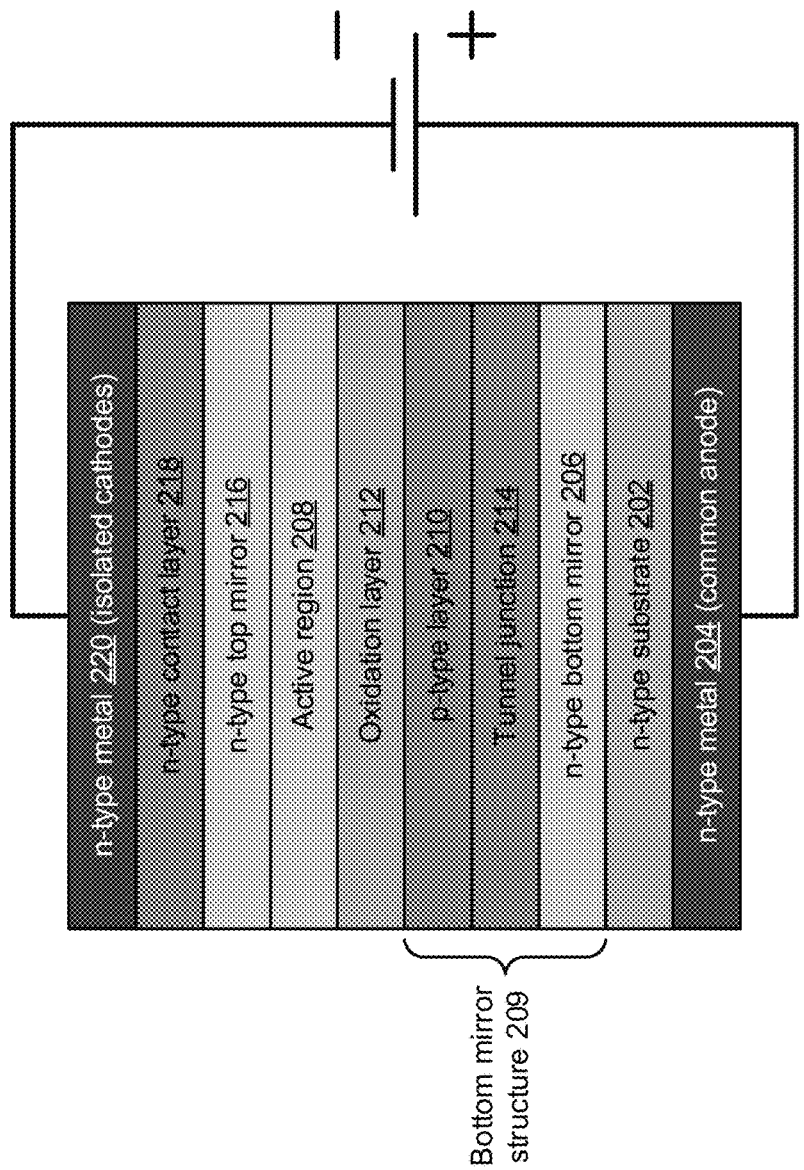
FIGS. 2A-2C are diagrams associated with a first example implementation of a VCSEL array having an isolated cathode and a common anode and a tunnel junction, as described herein.
Figure 2B:
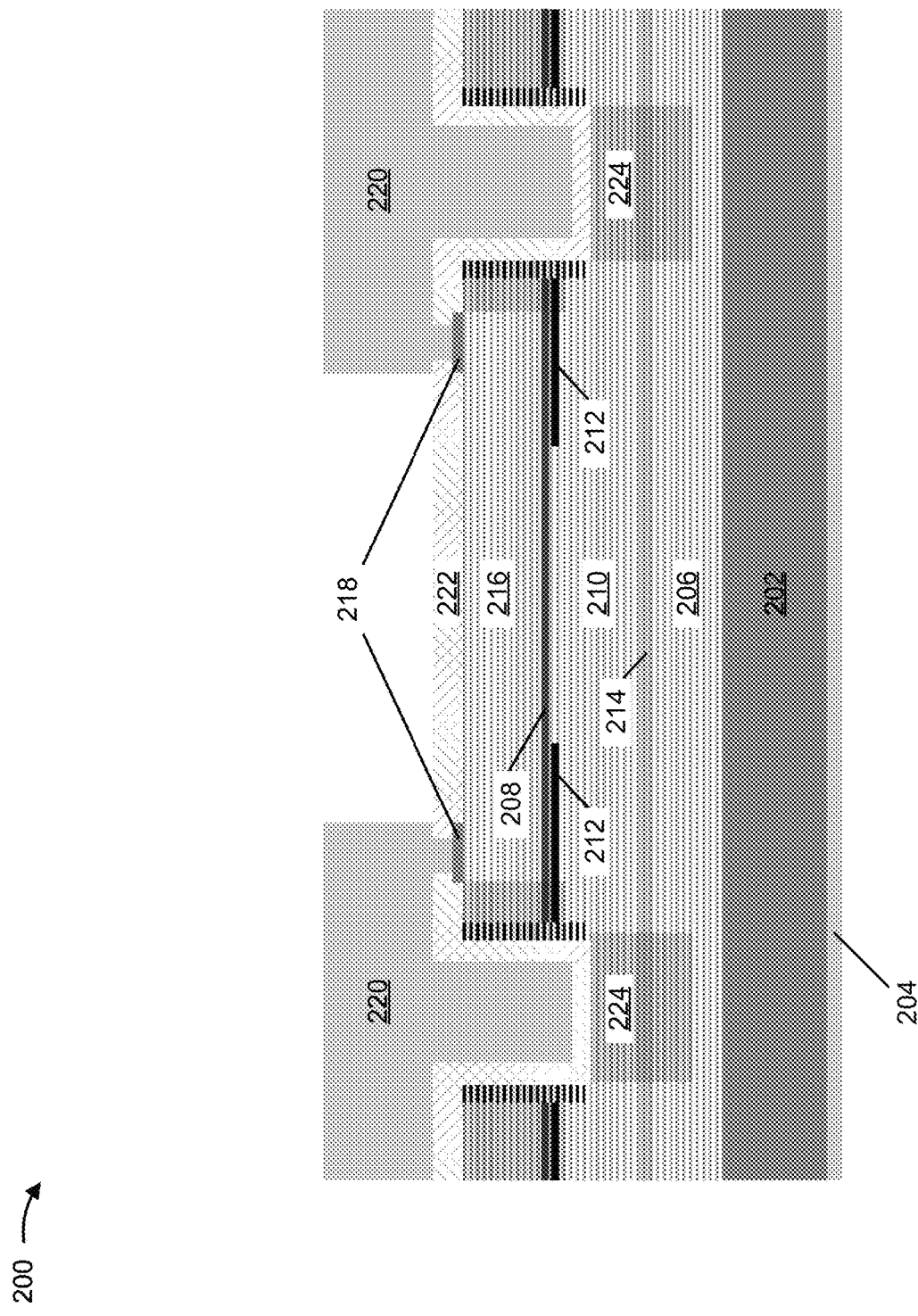
Figure 2C:
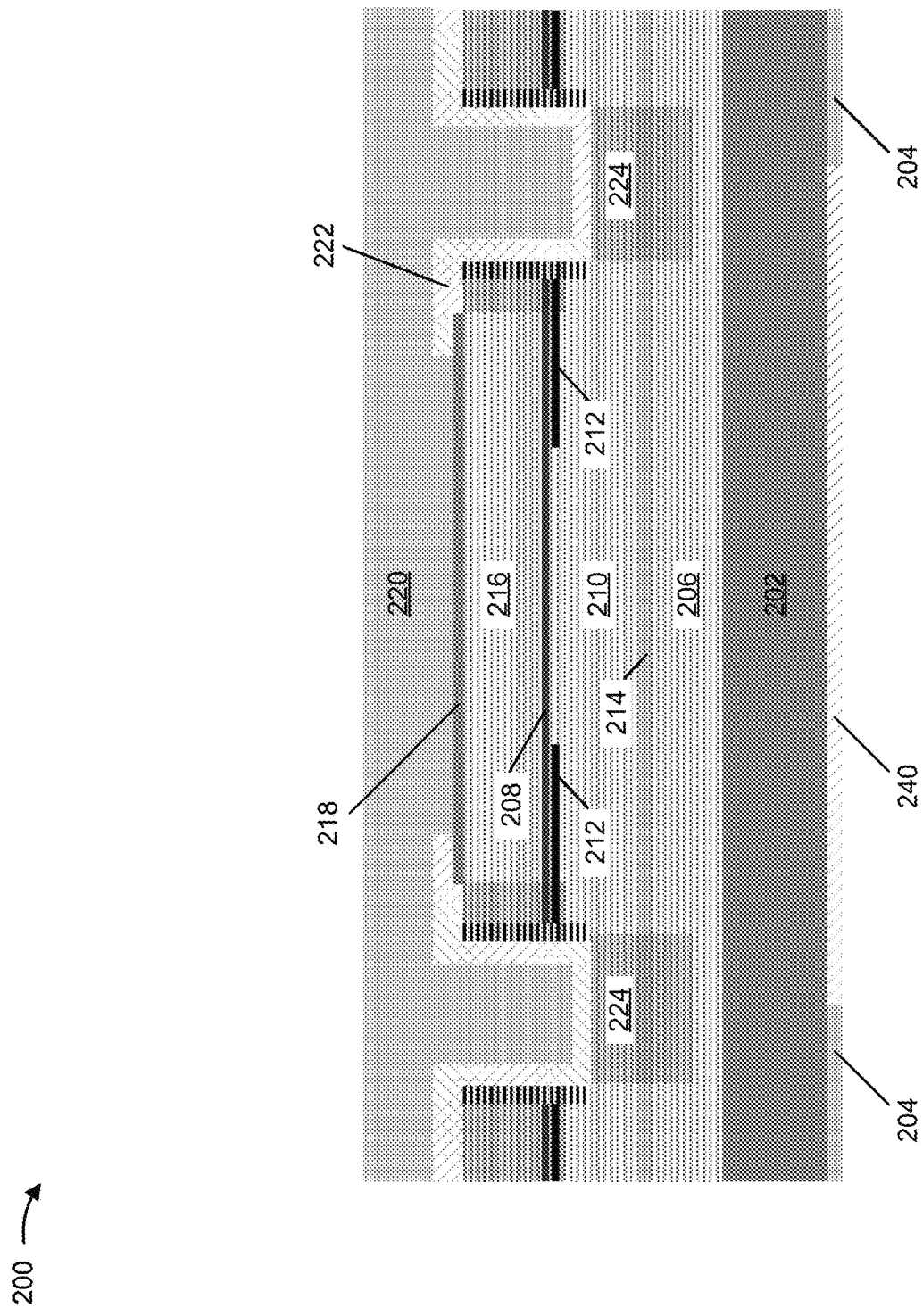

FIGS. 2A-2C are diagrams associated with a first example implementation of a VCSEL array 200 having an isolated cathode and a common anode and a tunnel junction. FIG. 2A is a diagram illustrating various layers of the VCSEL array 200. In some implementations, the VCSEL array 200 may be one of a group of sub-arrays of VCSELs formed on one or more chips (e.g., the group of sub-arrays may be formed on the same integrated circuit). As shown in FIG. 2A, the VCSEL array 200 may include an n-type substrate layer 202, an n-type metal 204, an n-type bottom mirror 206, an active region 208, a p-type layer 210, an oxidation layer 212, a tunnel junction 214, an n-type top mirror 216, an n-type contact layer 218, and an n-type metal 220. As noted in FIG. 2A, the n-type bottom mirror 206, the tunnel junction 214, and the p-type bottom mirror may be included in a bottom mirror structure 209 of the VCSEL array 200.

The n-type substrate layer 202 includes a substrate comprising an n-type material. In some implementations, other layers of the VCSEL array 200 are grown on the n-type substrate layer 202. In some implementations, the n-type substrate layer 202 may be formed from a semiconductor material, such as gallium arsenide (GaAs), indium phosphide (InP), or another type of semiconductor material.

The n-type metal 204 includes an n-type metal layer on a bottom surface of the n-type substrate layer 202 (e.g., at a backside of the VCSEL array 200). The n-type metal 204 is a layer that makes electrical contact with the n-type substrate layer 202 and forms a common anode for a group of VCSEL arrays including the VCSEL array 200. That is, the n-type metal 204 may serve as a common anode for a group of sub-arrays of a VCSEL array, the VCSEL array 200 being one of the group of sub-arrays. In some implementations, the n-type metal 204 may include an annealed metallization layer, such as a gold-germanium-nickel (AuGeNi) layer, a palladium-germanium-gold (PdGeAu) layer, among other examples.

The bottom mirror structure 209 includes the n-type bottom mirror 206, the tunnel junction 214, and the p-type layer 210. As shown the bottom mirror structure may be formed on a top surface of the n-type substrate layer 202.

The n-type bottom mirror 206 is a mirror section of the bottom mirror structure 209. In some implementations, the n-type bottom mirror 206 is portion of a bottom reflector of an optical resonator and is formed from an n-type material. For example, n-type bottom mirror 206 may include a DBR, a dielectric mirror, or another type of mirror structure. In some implementations, the n-type bottom mirror 206 is on a top surface of the n-type substrate layer 202, and the tunnel junction 214 is on the n-type bottom mirror 206. In some implementations, the n-type bottom mirror 206 may have a thickness in a range from approximately 3.5 microns (lam) to approximately 9 μm, such as 5 μm. In some implementations, the n-type bottom mirror 206 includes a set of layers (e.g., aluminum gallium arsenide (AlGaAs) layers) grown using a metal-organic chemical vapor deposition (MOCVD) technique, a molecular beam epitaxy (MBE) technique, or another technique.

The p-type layer 210 is a mirror section of the bottom mirror structure 209. In some implementations, the p-type layer 210 is a portion of the bottom reflector of the optical resonator and is formed from a p-type material. In some implementations, as shown in FIG. 2A, the p-type layer 210 may be between the tunnel junction 214 and the active region 208. In some implementations, the p-type layer 210 is on the tunnel junction 214 and the active region 208 is on the p-type layer 210. In some implementations, the p-type layer 210 may include a DBR, a dielectric mirror, or another type of mirror structure. In some implementations, the p-type layer 210 is a thin p-type DBR (p-DBR) (e.g., a p-DBR having fewer than six layer pairs) that forms a portion of the bottom reflector of the optical resonator. In some implementations, the p-type layer 210 is a p-type spacer layer (e.g., one layer of a single material, such as GaAs or AlGaAs) that supports hole injection in the active region 208 but does not serve as a portion of the bottom reflector of the optical resonator.

The tunnel junction 214 comprises one or more layers to reverse a carrier type within the bottom mirror structure 209. For example, the tunnel junction 214 may include one or more layers that convert electrons from the n-type bottom mirror 206 to holes in the p-type layer 210. In some implementations, the tunnel junction 214 is formed by placing one or more layers of highly doped n-type and p-type materials (typically referred to as n++ and p++, respectively). Due to a high intrinsic electric field formed by the junction of the highly doped materials, the tunnel junction 214 allows electrons injected from below the tunnel junction 214 (through the n-type bottom mirror 206) to be converted to holes above the tunnel junction 214 (in the p-type layer 210). In some implementations, the tunnel junction 214 may have a total thickness in a range from approximately 0.01 μm to approximately 0.12 μm. In some implementations, the tunnel junction 214 is within the bottom mirror structure 209, which permits a low resistance transition from the n-type bottom mirror 206 (i.e., the n-doped portion of the bottom mirror structure 209 grown upon the n-type substrate layer 202) to the p-type layer 210 (i.e., the p-doped portion of the bottom mirror structure 209 that is grown above the n-doped portion of the bottom mirror structure 209).

In some implementations, the tunnel junction 214 may be formed at any location in the bottom mirror structure 209. For example, the bottom mirror structure 209 may be formed at a top of the bottom mirror structure 209 (e.g., at a location in the bottom mirror structure 209 above which there are no more mirror pairs). As another example, the bottom mirror structure 209 may be formed at a bottom of the bottom mirror structure 209 (e.g., at a location below which there are no pairs). Notably, there is a trade-off in the voltage drop through the p-type layer 210 (e.g., one or more p-DBR pairs) versus the voltage drop through the tunnel junction 214. As the tunnel junction 214 is placed closer to the aperture formed by the oxidation layer 212 (i.e., higher in the bottom mirror structure 209), current is laterally confined to a narrower region and, therefore, the current density is higher, as is voltage drop across the tunnel junction 214. However, in such a case, there are fewer (higher resistance) p-DBR pairs through which current must pass. The p-DBR pairs generally have higher lateral resistance than n-DBR pairs and often have a higher vertical resistance. As the location of the tunnel junction 214 shifts closer to the n-type substrate layer 202, more p-DBR pairs are needed in the p-type layer 210 above the tunnel junction 214, but the current density and corresponding voltage drop across the tunnel junction 214 will be lower. Thus, the placement of the tunnel junction 214 within the bottom mirror structure 209 can be selected depending on the resistance of the tunnel junction 214. For sufficiently low tunnel junction resistance (e.g., less than approximately $2 \times 10^{-5}$ ohm-centimeters squared ($cm^2$)), placement of the tunnel junction 214 close to the oxide aperture may be advantageous to improve electrical to optical power conversion efficiency (e.g., as compared to common cathode designs of comparable materials without tunnel junctions).

Notably, the tunnel junction 214 may increase a voltage drop across the VCSEL in the VCSEL array 200 as compared to a typical common cathode design on an n-type substrate without any tunnel junction. However, a more appropriate comparison is to a common anode design on a p-type substrate. As noted above, p-type substrates have higher electrical resistance than n-type substrates. Consequently, the voltage drop across a properly designed tunnel junction 214 and the n-type substrate layer 202 may be lower than that of a p-type substrate for high density VCSEL arrays operating at several amperes per square millimeter.

The active region 208 includes one or more layers where electrons and holes recombine to emit light and define the emission wavelength range of the VCSEL array 200. For example, the active region 208 may include one or more quantum wells. In some implementations, the active region 208 may include one or more cavity spacer layers between the n-type top mirror 216 and the bottom mirror structure 209. The optical thickness of the active region 208 (including cavity spacer layers) and optical thickness of the n-type top mirror 216 and the bottom mirror structure 209 define the resonant cavity wavelength of the VCSEL array 200, which may be designed within an emission wavelength range of the active region to enable lasing. In some implementations, the active region 208 may be formed on the bottom mirror structure 209.

In some implementations, the active region 208 may be a single p-i-n junction with an intrinsic (i) region with light-emitting quantum wells. Alternatively, in some implementations, the active region 208 may be a multi-junction active region—a series of p-i-n junctions connected by tunnel junctions with a layer stack from (bottom-to-top) of p-i-n/n++/p++/p-i-n/n++/p++/p-i-n, where each intrinsic region includes light-emitting quantum wells. In some implementations, the active region 208 may have a thickness in a range from approximately 0.06 lam to approximately 0.5 µm, such as 0.15 µm or 0.30 µm. In some implementations, the active region 208 includes a set of layers grown using an MOCVD technique, an MBE technique, or another technique.

The oxidation layer 212 includes an oxide layer that forms an oxide aperture for providing optical and electrical confinement for the VCSELs of the VCSEL array 200. In some implementations, the oxidation layer 212 is formed as a result of oxidation of one or more epitaxial layers of the VCSEL array 200. For example, the oxidation layer 212 may be an aluminum oxide ($Al_2O_3$) layer formed as a result of oxidation of an epitaxial layer (e.g., an AlGaAs layer, an aluminum arsenide (AlAs) layer, and/or the like). In some implementations, the oxidation layer 212 may have a thickness in a range from approximately 0.007 µm to approximately 0.04 µm, such as 0.02 µm. In some implementations, oxidation trenches (not shown in FIG. 2A, and shown as filled in FIGS. 2B and 2C) etched around the VCSELs in the VCSEL array 200 may allow steam to access the epitaxial layer(s) from which the oxidation layer 212 is formed. In some implementations, the oxide aperture has a circular shape. In some implementations, the oxide aperture has a non-circular shape. In some implementations, a size (e.g., a diameter) of the oxide aperture formed by the oxidation layer 212 is in a range from approximately 1 µm to approximately 300 µm, such as 5 µm or 8 µm. In some implementations, the oxidation layer 212 (that forms the oxide aperture of the VCSEL) within the bottom mirror structure 209 is under (i.e., on the substrate-side of) the active region 208. In some implementations, the oxidation layer 212 may be over the active region 208 (e.g., in the n-type top mirror 216) and is on or in the n-type top mirror 216.

The n-type top mirror 216 is a top reflector of the optical resonator and is formed from an n-type material. For example, the n-type top mirror 216 may include a DBR, a dielectric mirror, and/or the like. In some implementations, the n-type top mirror 216 may have a thickness in a range from approximately 1 µm to approximately 6 µm, such as 3 µm. In some implementations, the n-type top mirror 216 is grown on the n-side of the active region 208.

The n-type contact layer 218 is a top contact layer of the VCSEL array 200 that makes electrical contact with the n-type top mirror 216 through which current may flow. In some implementations, the n-type contact layer 218 includes an annealed metallization layer. For example, the n-type contact layer 218 may include a chromium-gold (Cr—Au) layer, a gold-zinc (Au—Zn), a titanium-platinum-gold (TiPtAu) layer, a gold-germanium-nickel (AuGeNi) layer, a palladium-germanium-gold (PdGeAu) layer, or the like. In some implementations, the n-type contact layer 218 has a thickness in a range from approximately 0.03 µm to approximately 0.3 µm, such as 0.2 µm. In some implementations, the n-type contact layer 218 has a ring shape, a slotted ring shape, a tooth wheel shape, or another type of circular or non-circular shape (e.g., depending on a design of the VCSELs in the VCSEL array 200).

The n-type metal 220 is a top metal layer at a front side of the VCSEL array 200. For example, the n-type metal 220 may be a layer that makes electrical contact with the n-type contact layer 218. In some implementations, the n-type metal 220 may form an isolated cathode for the VCSEL array 200. That is, the n-type metal 204 may serve as an isolated cathode for a particular sub-array of a VCSEL array including a group of sub-arrays, the VCSEL array 200 being one of the group of sub-arrays.

FIG. 2B is a diagram illustrating an example of a cross section of a design for a top-emitting VCSEL in the VCSEL array 200 with the layers shown in FIG. 2A. As shown in FIG. 2B, the n-type metal 220 is insulated from sidewalls of the trenches by a dielectric layer 222, which may be, for example, silicon nitride (SiN), silicon dioxide ($SiO_2$), a polymer dielectric, or another type of insulating material. Additionally, as shown in FIG. 2B, the VCSEL may have an isolation implant 224 to prevent free carriers from reaching edges of the trenches and/or to isolate adjacent VCSELs in the VCSEL array 200 from one another (e.g., if the trenches do not fully enclose the VCSELs of the VCSEL array 200).

FIG. 2C is a diagram illustrating an example of a cross section of a design for a bottom-emitting VCSEL in the VCSEL array 200 with the layers shown in FIG. 2A. The structure of the bottom-emitting VCSEL is similar to that of the top-emitting VCSEL shown in FIG. 2B, except that an opening is present in the n-type metal 204 to permit emission of light out of the n-type substrate layer 202. In some implementations, as shown in FIG. 2C, an anti-reflective (AR) coating 240 may be formed in the opening in the n-type metal 204. As further shown in FIG. 2C, in the bottom-emitting VCSEL, the n-type metal 220 covers the top surface of the VCSEL emitter over the n-type contact layer 218. Similar to the top-emitting VCSEL, the tunnel junction 214 is within the bottom mirror structure to transition at low resistance from the n-type bottom mirror 206 to the p-type layer 210.

Notably, in a typical common cathode structure for a VCSEL array, the top contact is to a p-type material made with a high (e.g., greater than approximately $5 \times 10^{19}$ cm$^{-3}$) p-type doping at the surface. Such high doping permits a tunnel contact with some materials (e.g., titanium, platinum, gold) which may be deposited before oxidation and need not alloy with the surface to achieve low contact resistance. Further, it is beneficial to deposit the ohmic contact prior to trench etching when (with a planar surface) it is simpler to define dense lithographic features. However, the ohmic contact must survive oxidation at temperatures around 400 degrees Celsius (° C.) for many minutes. In the case of a common anode design described above with respect to FIGS. 2A-2C, the top metal contact is nominally to an n-type material (e.g., n-type contact layer 218). However, common alloy structures for such n-type contacts in GaAs (e.g., gold-germanium (Au—Ge)) are sensitive to anneal conditions and typically degrade (e.g., increase resistance) significantly if heated for too long around 400° C. Low temperature alloy materials (e.g., palladium, germanium) also increase resistance significantly during such a process. To overcome this, in some implementations, the top-most epitaxial layer(s) of VCSEL array 200 may be highly (e.g., greater than $5 \times 10^{18}$ cm$^{-3}$) n-doped with a dopant (e.g., tellurium, selenium, or the like), which can achieve high electron concentrations without saturating, as occurs when doping GaAs with silicon. High spike n-doping makes possible the use of a non-alloyed ohmic contact (e.g., titanium, platinum, gold, or the like)—which normally would form a diode (Schottky) contact to moderately (e.g., from approximately $3 \times 10^{17}$ cm$^{-3}$ to approximately $3 \times 10^{18}$ cm$^{-3}$) n-doped GaAs, and makes the use of traditional GaAs n-type contact (e.g., palladium, germanium, or the like) less sensitive to prolonged exposure to high temperature. It is also possible to dope the surface n-type in a lower range (e.g., from $5 \times 10^{17}$ cm$^{-3}$ to approximately $3 \times 10^{18}$ cm$^{-3}$) and achieve sufficient ohmic contact with traditional n-contact materials deposited after the oxidation process but, as noted, with the presence of oxidation trenches, photolithography may be challenging and difficulty in defining narrow features may be increased (e.g., as compared to when the surface is planar).

The number, arrangement, thicknesses, order, symmetry, or the like, of layers shown in FIGS. 2A-2C are provided as examples. In practice, VCSEL array 200 may include additional layers, fewer layers, different layers, differently constructed layers, or differently arranged layers than those shown in FIGS. 2A-2C. Additionally, or alternatively, a set of layers (e.g., one or more layers) of VCSEL array 200 may perform one or more functions described as being performed by another set of layers of VCSEL array 200 and any layer may comprise more than one layer.

In some implementations, to simplify fabrication and follow similar steps to those associated with fabricating a common cathode VCSEL array, it may be desirable to insert an additional tunnel junction below the top surface of the VCSEL array 200 and with a p++ layer continuing to the surface of the VCSEL array 200. In this manner, the top contact of the VCSEL array 200 be permitted to be a p-type contact and may be formed as a tunnel contact (e.g., titanium, platinum, gold, or the like) that is compatible with high temperature oxidation. In some implementations, the second tunnel junction may be of even lower resistance than the tunnel junction 214 due to exposure to the elevated growth temperatures for a comparatively shorter amount of time.

Figure 3A:
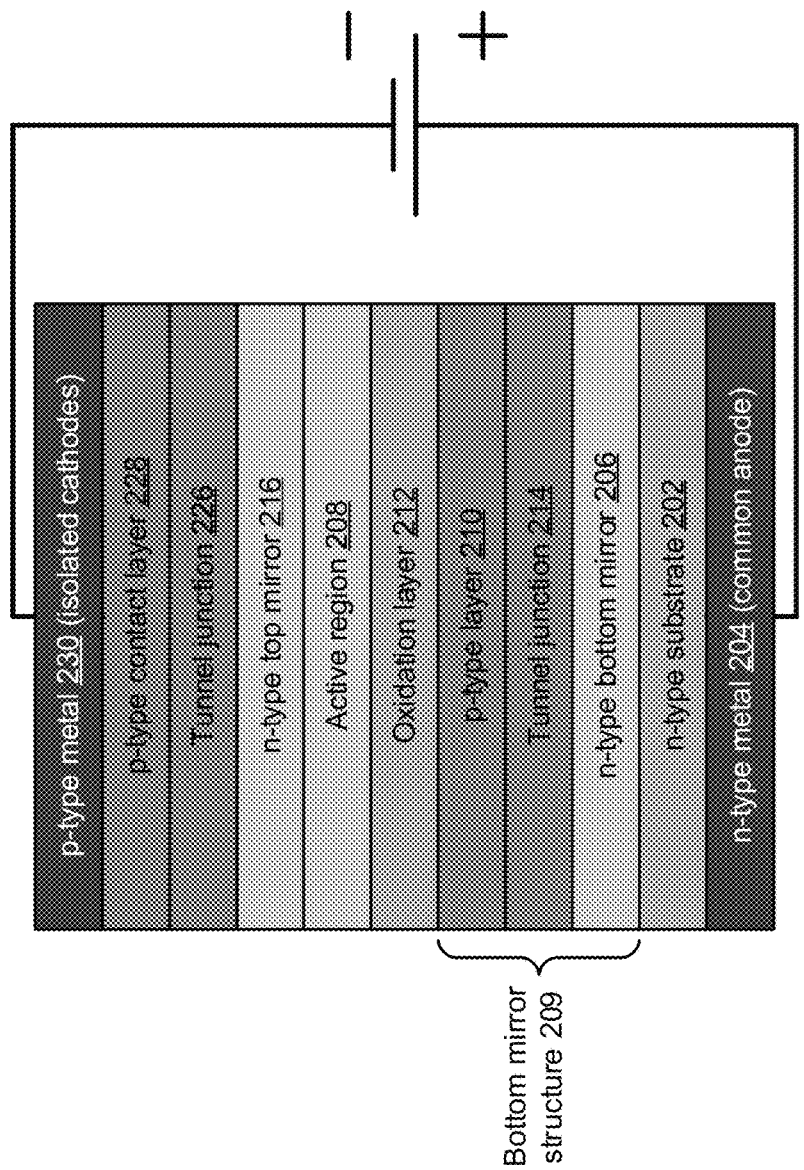
FIGS. 3A-3C are diagrams associated with second example implementation of a VCSEL array having an isolated cathode and a common anode and multiple tunnel junctions, as described herein.
Figure 3B:
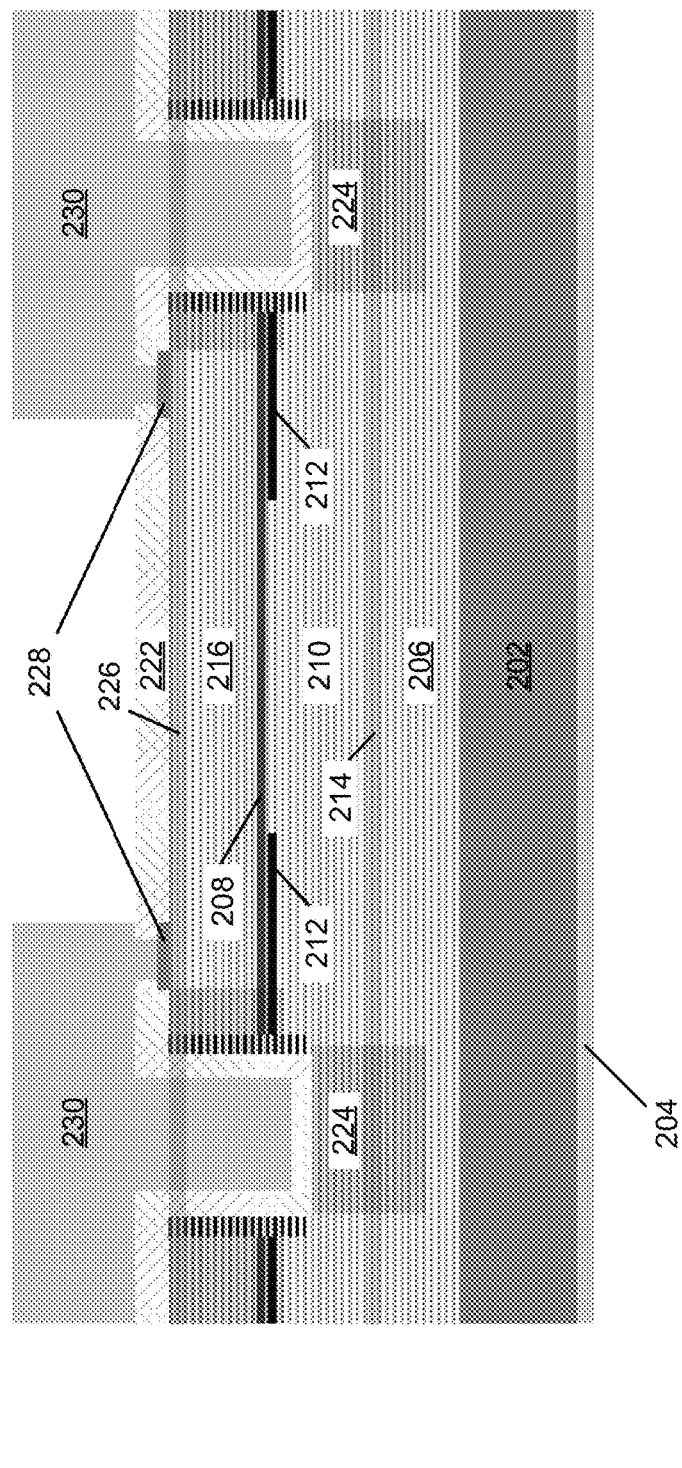
Figure 3C:
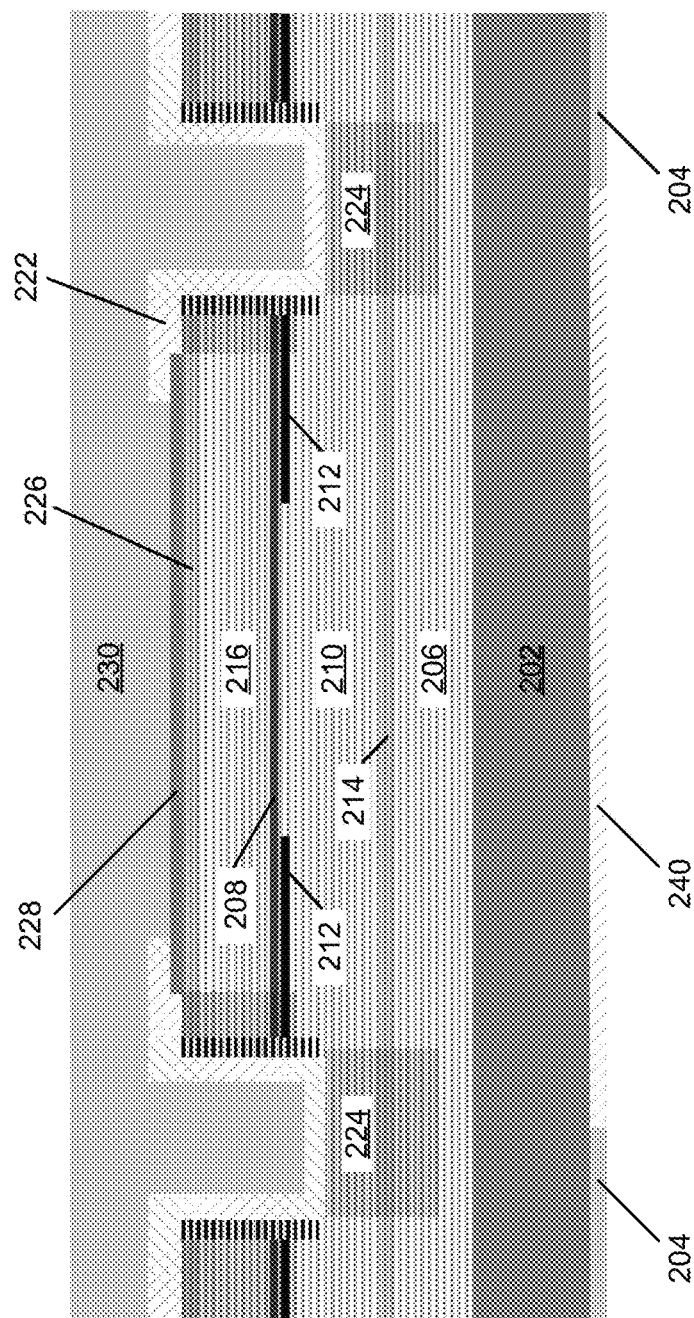

FIGS. 3A-3C are diagrams associated with a second example implementation of the VCSEL array 300 having an isolated cathode and a common anode and multiple tunnel junctions. FIG. 3A is a diagram illustrating various layers of the VCSEL array 300, while FIG. 3B is a diagram illustrating an example of a cross section of a design for a top-emitting VCSEL in the VCSEL array 300 with the layers shown in FIG. 3A. FIG. 3C is a diagram illustrating an example of a cross section of a design for a bottom-emitting VCSEL in the VCSEL array 300 with the layers shown in FIG. 3A.

As illustrated by comparing FIGS. 2A-2C and FIGS. 3A-3C, the structure of the VCSEL array 300 is similar to that of the VCSEL array 200 except that the VCSEL array 300 includes a tunnel junction 226 on the n-type top mirror 216, a p-type contact layer 228 over the tunnel junction 226 (e.g., rather than an n-type contact layer 218) and a p-type metal 230 on the p-type contact layer 228 (e.g., rather than an n-type metal 220). As described above, by including the second tunnel junction 226, the top contact of the VCSEL array 300 is permitted to be a p-type contact and may be formed as a tunnel contact (e.g., titanium, platinum, gold, or the like) that is compatible with high temperature oxidation.

The number, arrangement, thicknesses, order, symmetry, or the like, of layers shown in FIGS. 3A-3C are provided as examples. In practice, VCSEL array 300 may include additional layers, fewer layers, different layers, differently constructed layers, or differently arranged layers than those shown in FIGS. 3A-3C. Additionally, or alternatively, a set of layers (e.g., one or more layers) of VCSEL array 300 may perform one or more functions described as being performed by another set of layers of VCSEL array 300 and any layer may comprise more than one layer.

In some implementations, a VCSEL array 200/300 may be manufactured using a series of procedures. For example, one or more layers of VCSEL array 200/300 may be created using one or more growth procedures, one or more deposition procedures, one or more etching procedures, one or more oxidation procedures, one or more implantation procedures, and/or one or more metallization procedures, among other examples.

A particular example of a process for fabricating a VCSEL array 200/300 is as follows. First, crystalline layers (e.g., GaAs/AlGaAs layers) may be grown (e.g., laterally uniform) upon an n-type substrate layer 202 (e.g., an n-type GaAs substrate) to form the bottom mirror structure 209

(e.g., the n-type bottom mirror 206, the tunnel junction 214, the p-type layer 210), oxidation layer 212, active region 208, the n-type top mirror 216 (and the tunnel junction 226 in the case of VCSEL array 300). Next, the top contact layer (e.g., the n-type contact layer 218 or the p-type contact layer 228 may be deposited. This step could also be performed after oxidation of the oxidation layer 212 as described below. Next, trenches may be etched to permit lateral oxidation (either partially or fully surrounding emitters). Next, the oxidation layer 212 (e.g., higher Al content layer(s)) may be oxidized to form the oxide aperture(s). Next, emitters belonging to different cathodes can be isolated by ion implantation (e.g., formation of isolation implant 224) (e.g., when emitters are not isolated by etching in the previous step, or when additional isolation is desired). Next, interconnect and pad metallization (e.g., the n-type metal 220, the p-type metal 230) is deposited as needed. Next, the n-type substrate layer 202 may be thinned (e.g., as required for wafer dicing). Next, the n-type metal 204 may be deposited on the backside of the thinned n-type substrate layer 202. Finally, the wafer may be diced into individual die. Notably, there may be one or more additional steps performed at various points between the above described steps, such as surface passivation, strain compensation, heat treatment, photolithography, cleaning, patterning, or the like. Further, some of the above described steps may require patterning of the wafer to be performed (e.g., in order to etch, metalize, or isolate only specific regions across each VCSEL array 200/300 or within each emitter).

Figure 4A:
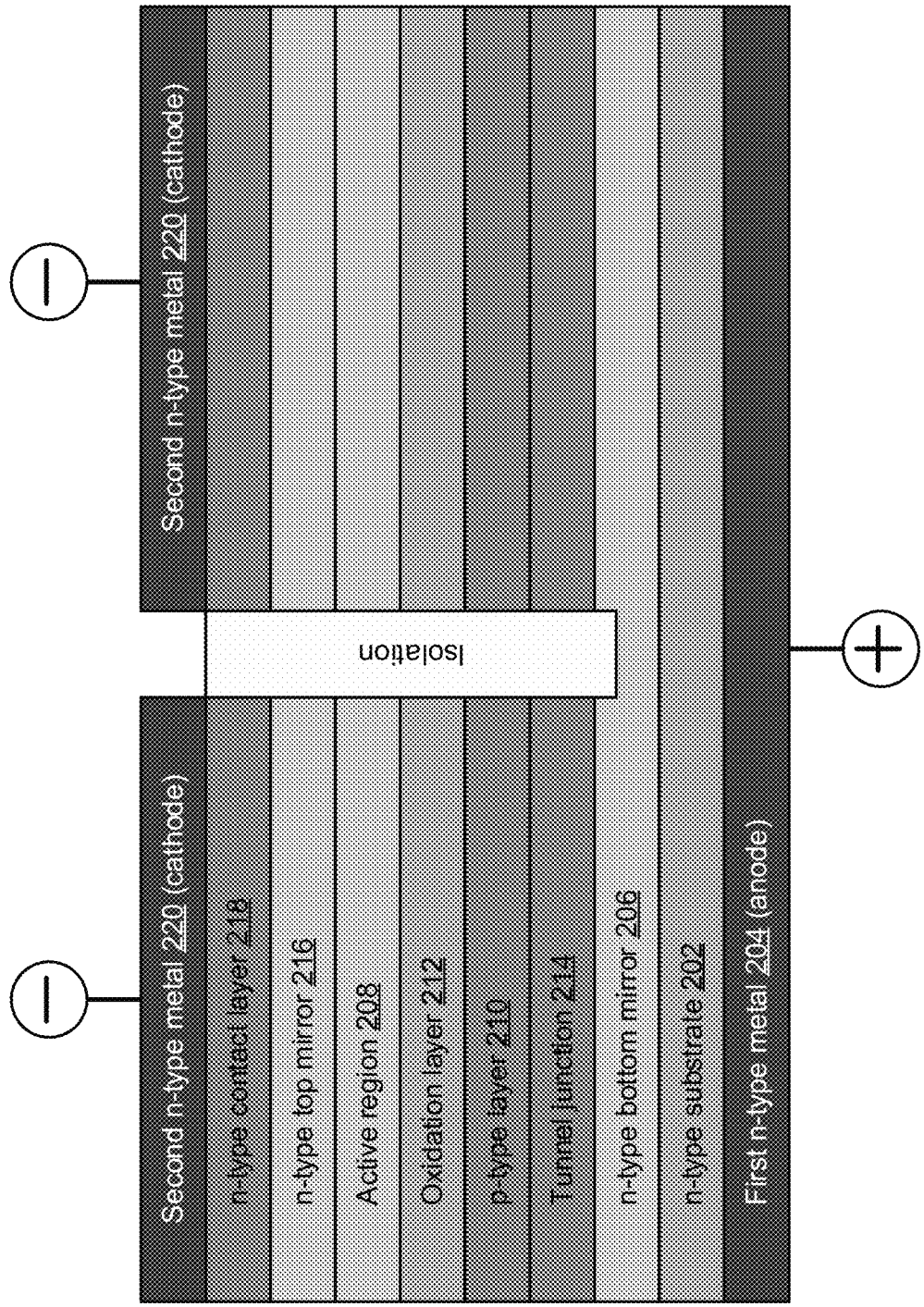
FIGS. 4A and 4B are diagrams illustrating examples of VCSEL arrays having isolated cathode contacts upon an n-type substrate serving as the common anode, as described herein.
Figure 4B:
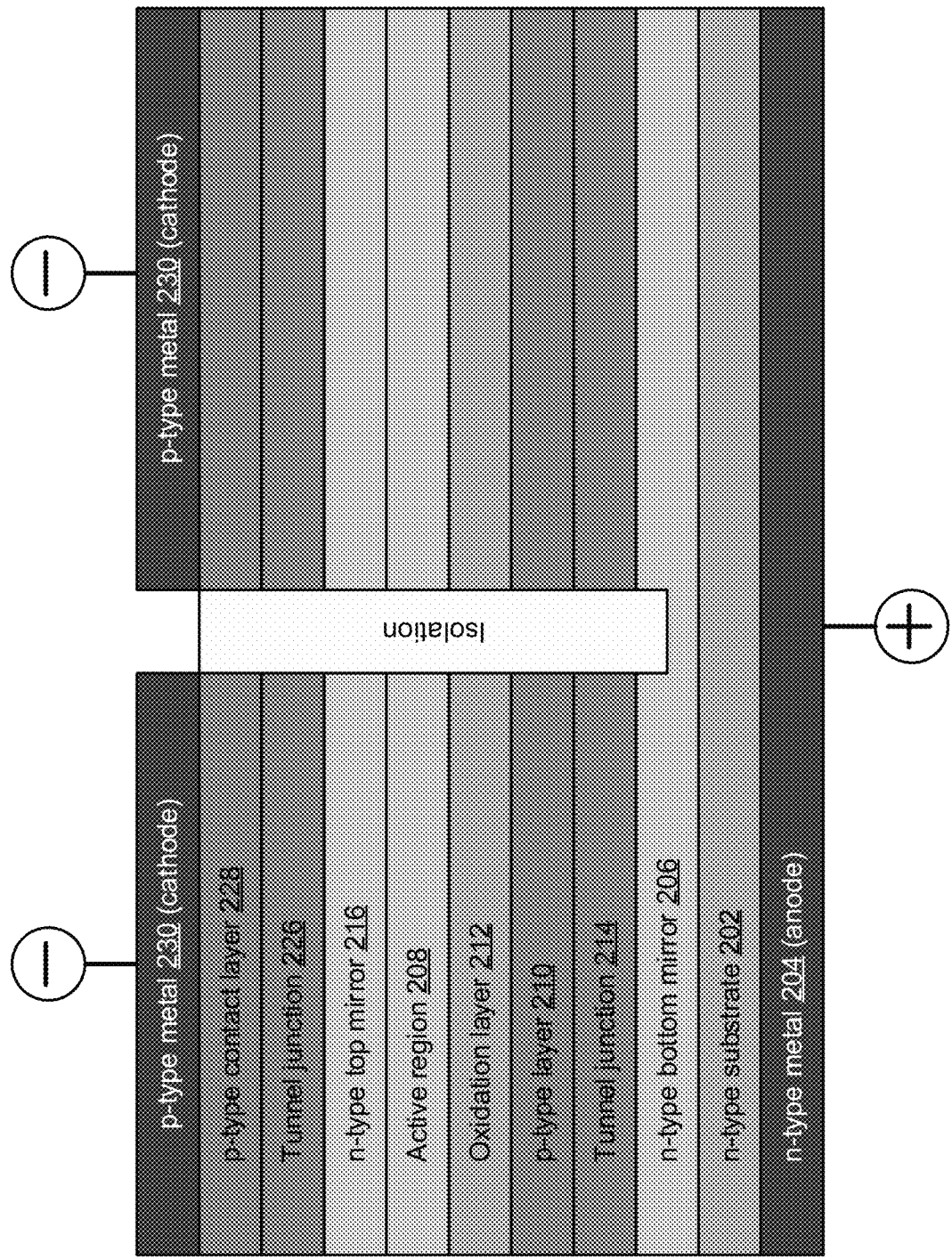

In some implementations, multiple VCSEL arrays 200/300 may be formed on a single chip and may share a common substrate anode contact while having isolated cathode contacts. FIG. 4A illustrates an example of two VCSEL arrays 200 having isolated cathode contacts upon the n-type substrate serving as the common anode. FIG. 4B illustrates an example of two VCSEL arrays 300 having isolated cathode contacts upon the n-type substrate serving as the common anode.

The number, arrangement, thicknesses, order, symmetry, or the like, of layers shown in FIGS. 4A and 4B are provided as examples. In practice, VCSEL 200 may include additional layers, fewer layers, different layers, differently constructed layers, or differently arranged layers than those shown in FIGS. 4A and 4B.

Figure 5B:
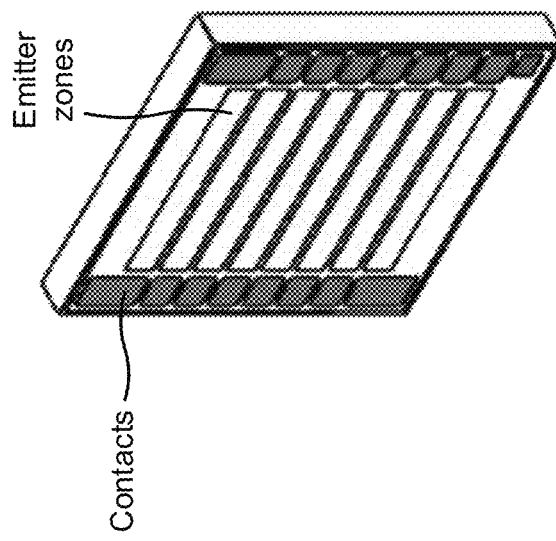
FIGS. 5A-5C are diagrams illustrating example arrangements for VCSEL arrays in an optical device, as described herein.
Figure 5A:
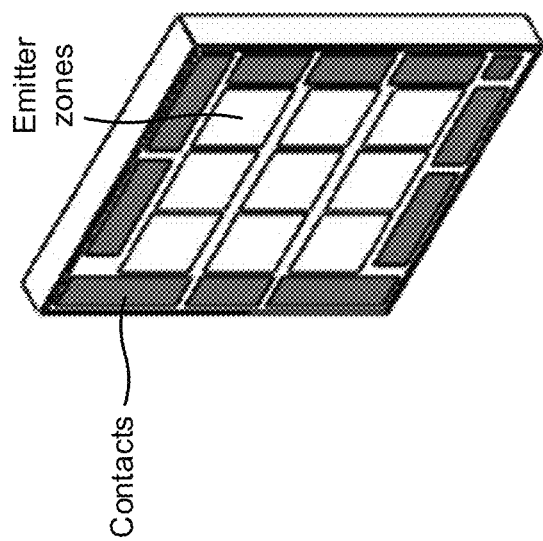
Figure 5C:
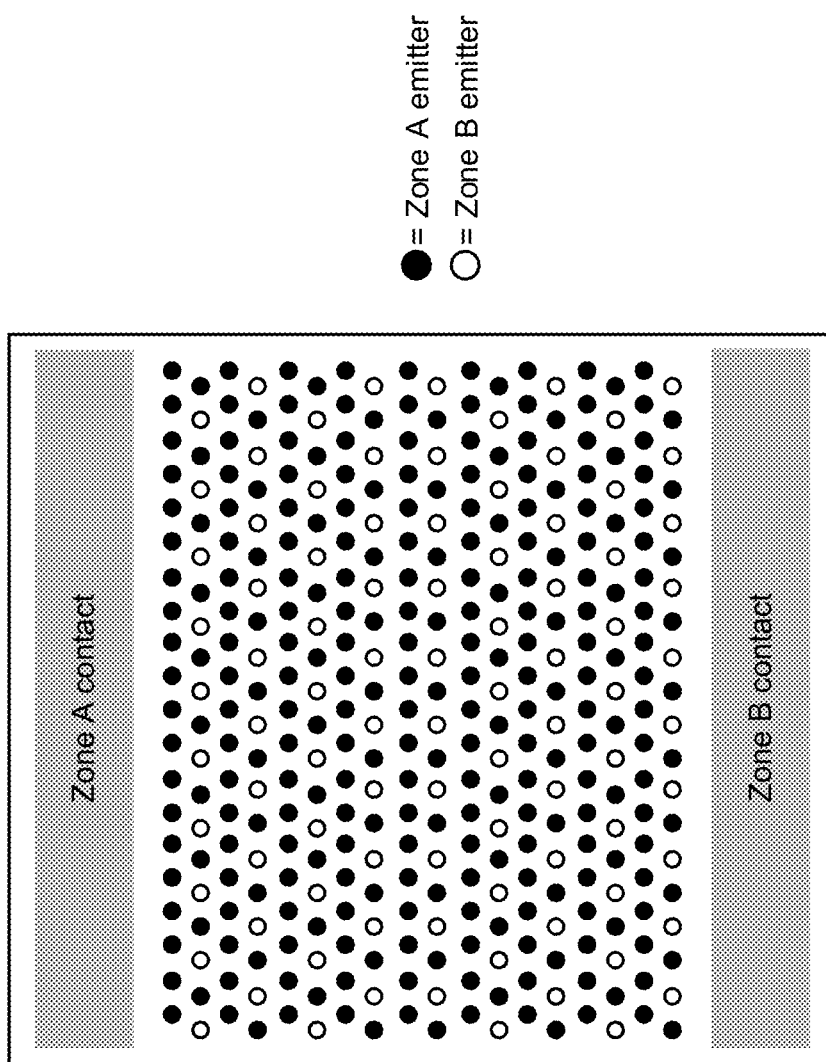

FIGS. 5A-5C are diagrams illustrating example arrangements for VCSEL arrays 200/300 in an optical device. In FIGS. 5A and 5B, each emitter zone corresponds to emission areas for a respective VCSEL array 200/300, each of which is served by one of the separate contact pads. In some implementations, as shown in FIG. 5C, the VCSEL arrays 200/300 may not be separated. Rather, VCSELs in the zones (e.g., zone A and zone B, as indicated in FIG. 5C) can be interleaved so long as a VCSEL in a given zone is isolated from VCSELs in the other zone.

As indicated above, FIGS. 5A-5C are provided as an example. Other examples may differ from what is described with regard to FIGS. 5A-5C.

Figure 6:
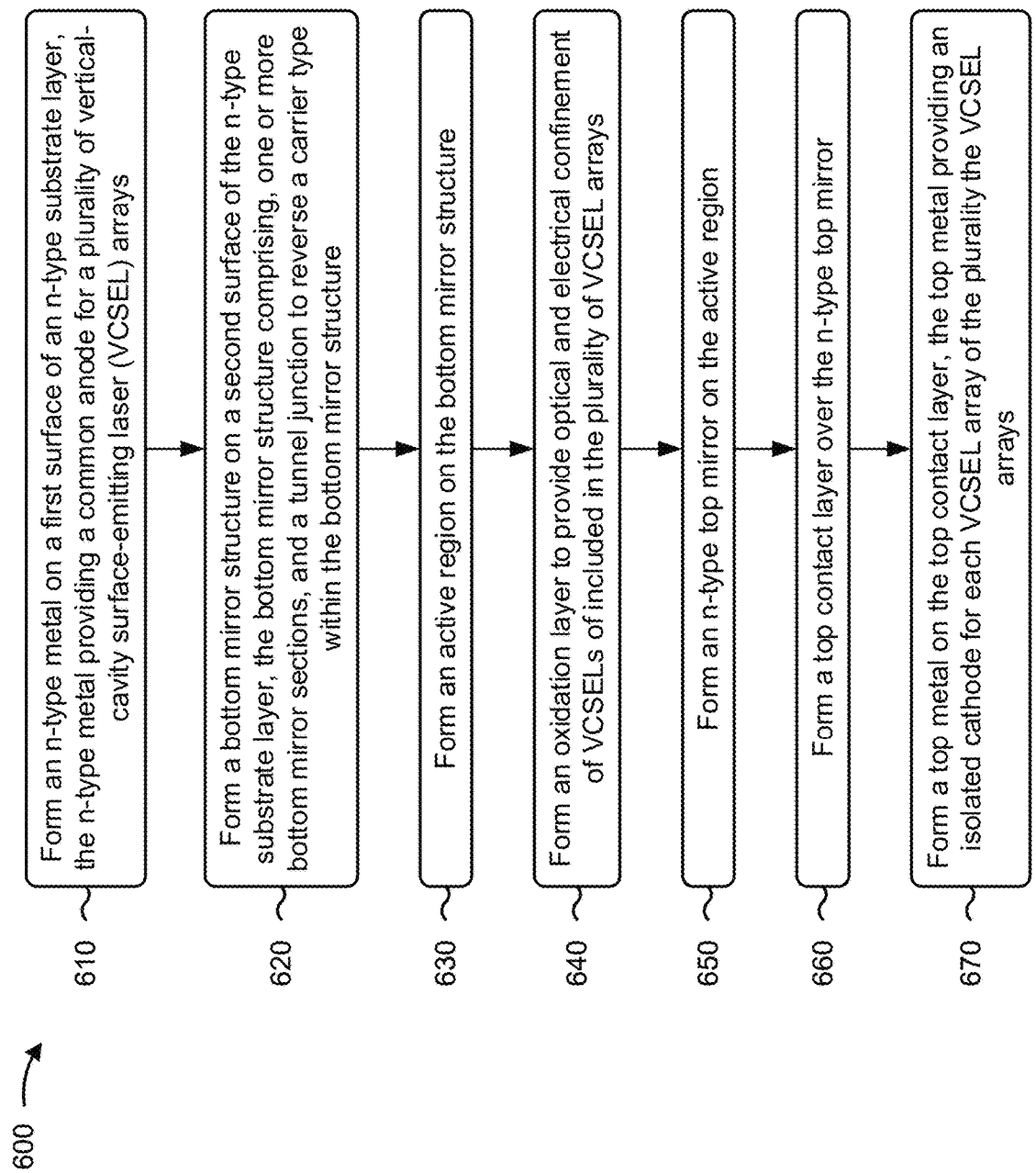
FIG. 6 is a flowchart of an example process relating to manufacturing a VCSEL array having an isolated cathode and a common anode and a tunnel junction, as described herein.

FIG. 6 is a flowchart of an example process 600 relating to manufacturing a VCSEL array having an isolated cathode and a common anode and a tunnel junction.

As shown in FIG. 6, process 600 may include forming an n-type metal on a first surface of an n-type substrate layer, the n-type metal providing a common anode for a plurality of VCSEL arrays (block 610). For example, an n-type metal 204 may be formed on a first surface of an n-type substrate layer 202, the n-type metal 204 providing a common anode for a plurality of VCSEL arrays 200, as described above.

As further shown in FIG. 6, process 600 may include forming a bottom mirror structure on a second surface of the n-type substrate layer, the bottom mirror structure comprising one or more bottom mirror sections and a tunnel junction to reverse a carrier type within the bottom mirror structure (block 620). For example, a bottom mirror structure 209 may be formed on a second surface of the n-type substrate layer 202, the bottom mirror structure 209 comprising one or more bottom mirror sections (e.g., n-type bottom mirror 206 and/or p-type layer 210) and a tunnel junction 214 to reverse a carrier type within the bottom mirror structure 209, as described above.

As further shown in FIG. 6, process 600 may include forming an active region on the bottom mirror structure (block 630). For example, an active region 208 may be formed on the bottom mirror structure 209, as described above.

As further shown in FIG. 6, process 600 may include forming an oxidation layer to provide optical and electrical confinement of VCSELs of included in the plurality of VCSEL arrays (block 640). For example, an oxidation layer 212 may be formed to provide optical and electrical confinement of VCSELs of included in the plurality of VCSEL arrays 200, as described above.

As further shown in FIG. 6, process 600 may include forming an n-type top mirror on the active region (block 650). For example, an n-type top mirror 216 may be formed on the active region 208, as described above.

As further shown in FIG. 6, process 600 may include forming a top contact layer over the n-type top mirror (block 660). For example, a top contact layer (e.g., n-type contact layer 218, p-type contact layer 228) may be formed over the n-type top mirror 216, as described above.

As further shown in FIG. 6, process 600 may include forming a top metal on the top contact layer, the top metal providing an isolated cathode for each VCSEL array of the plurality the VCSEL arrays (block 670). For example, a top metal (e.g., n-type metal 220, p-type metal 230) may be formed on the top contact layer, the top metal providing an isolated cathode for each VCSEL array 200 of the plurality the VCSEL arrays 200, as described above.

Process 600 may include additional implementations, such as any single implementation or any combination of implementations described below and/or in connection with one or more other processes described elsewhere herein.

In a first implementation, the top contact layer is an n-type contact layer 218 and the top metal is another n-type metal (e.g., n-type metal 220), the n-type contact layer 218 being on the n-type top mirror 216 and the other n-type metal being on the n-type contact layer 218.

In a second implementation, alone or in combination with the first implementation, the oxidation layer 212 is under the active region 208 and is on or in the bottom mirror structure 209.

In a third implementation, alone or in combination with one or more of the first and second implementations, the one or more bottom mirror sections include an n-type bottom mirror section (e.g., n-type bottom mirror 206), wherein the n-type bottom mirror section is on the second surface of the n-type substrate layer 202, and the tunnel junction 214 is on the n-type bottom mirror section.

In a fourth implementation, alone or in combination with one or more of the first through third implementations, the one or more bottom mirror sections include a p-type bottom mirror section (e.g., p-type layer 210), wherein the p-type bottom mirror section is on the tunnel junction 214, and the active region 208 is on the p-type bottom mirror section.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

The foregoing disclosure provides illustration and description, but is not intended to be exhaustive or to limit the implementations to the precise form disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "over," "under," "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A vertical-cavity surface-emitting laser (VCSEL) array, comprising:
    an n-type substrate layer having a top surface and a bottom surface;
    an n-type metal on the bottom surface of the n-type substrate layer, the n-type metal forming a common anode for a group of VCSEL arrays including the VCSEL array;
    an n-type bottom mirror section on the top surface of the n-type substrate layer;
    a first tunnel junction to reverse a carrier type on the n-type bottom mirror section;
    a second tunnel junction, the second tunnel junction being on an n-type top mirror;
    a p-type top contact layer on the second tunnel junction; and
    a p-type metal on the p-type top contact layer; and
    a driver circuit to provide current to the VCSEL array, the driver circuit comprising at least one of:
        one or more n-channel metal oxide semiconductor field-effect transistors (MOSFETs), or
        one or more n-p-n bi-polar junction transistors (BJTs).

2. The VCSEL array of claim 1, wherein the group of VCSEL arrays is on a same integrated circuit.

3. The VCSEL array of claim 1, wherein the driver circuit comprises a plurality of n-channel MOSFETs.

4. The VCSEL array of claim 1, wherein the driver circuit comprises a plurality of n-p-n BJTs.

5. The VCSEL array of claim 1, further comprising:
    an oxidation layer to provide optical and electrical confinement of VCSELs of the VCSEL array;
    an active region over the oxidation layer; and
    the n-type top mirror on the active region.

6. The VCSEL array of claim 5, wherein the oxidation layer is under the active region and is on or in a bottom mirror structure.

7. The VCSEL array of claim 5, wherein the oxidation layer is over the active region and is on or in the n-type top mirror.

8. An optical device, comprising:
    a plurality of vertical-cavity surface-emitting laser (VCSEL) arrays, the plurality of VCSEL arrays including:
        an n-type substrate layer having a top surface and a bottom surface;
        an n-type metal on the bottom surface of the n-type substrate layer, the n-type metal forming a common anode for the plurality of VCSEL arrays including the VCSEL array;
        an n-type bottom mirror section on the top surface of the n-type substrate layer;
        a first tunnel junction to reverse a carrier type on the n-type bottom mirror section;
        a second tunnel junction, the second tunnel junction being on an n-type top mirror;
        a p-type top contact layer on the second tunnel junction; and
        a p-type metal on the p-type top contact layer; and
    driver circuitry to provide current to the plurality of VCSEL arrays, the driver circuitry comprising at least one of:
        one or more n-channel metal oxide semiconductor field-effect transistors (MOSFETs), or
        one or more n-p-n bi-polar junction transistors (BJTs).

9. The optical device of claim 8, wherein the plurality of VCSEL arrays are on a same integrated circuit.

10. The optical device of claim 8, wherein the driver circuitry comprises a plurality of n-channel MOSFETs.

11. The optical device of claim 8, wherein the driver circuitry comprises a plurality of n-p-n BJTs.

12. The optical device of claim 8, further comprising:
    an oxidation layer to provide optical and electrical confinement of VCSELs of the VCSEL array;
    an active region over the oxidation layer; and
    the n-type top mirror on the active region.

13. The optical device of claim 12, wherein the oxidation layer is under the active region and is on or in a bottom mirror structure.

14. The optical device of claim 12, wherein the oxidation layer is over the active region and is on or in an n-type top mirror.

15. A method, comprising:
forming an n-type metal on a first surface of an n-type substrate layer, the n-type metal providing a common anode for a plurality of vertical-cavity surface-emitting laser (VCSEL) arrays;
forming an n-type bottom mirror section on a second surface of the n-type substrate layer;
forming a first tunnel junction to reverse a carrier type on the n-type bottom mirror section;
forming a second tunnel junction on an n-type mirror;
forming a p-type top contact layer on the second tunnel junction;
forming a p-type metal on the p-type top contact layer; and
providing current to the plurality of VCSEL arrays via driver circuitry, the driver circuitry comprising at least one of:
one or more n-channel metal oxide semiconductor field-effect transistors (MOSFETs), or
one or more n-p-n bi-polar junction transistors (BJTs).

16. The method of claim 15, further comprising:
forming an oxidation layer to provide optical and electrical confinement of VCSELs of the VCSEL arrays;
forming an active region over the oxidation layer; and
forming the n-type top mirror on the active region.

17. The method of claim 16, further comprising:
forming the oxidation layer under the active region and on or in a bottom mirror structure.

18. The method of claim 16, further comprising:
forming the oxidation layer over the active region and on or in the n-type top mirror.

19. The method of claim 15, further comprising:
wherein the plurality of VCSEL arrays are formed on a same integrated circuit.

* * * * *